United States Patent
Niu et al.

(10) Patent No.: US 7,751,506 B2
(45) Date of Patent: Jul. 6, 2010

(54) METHOD FOR THE SOFT BIT METRIC CALCULATION WITH LINEAR MIMO DETECTION FOR LDPC CODES

(75) Inventors: Huaning Niu, Santa Clara, CA (US); Chiu Ngo, San Francisco, CA (US)

(73) Assignee: Samsung Electronics Co., Ltd., Suwon (KR)

(*) Notice: Subject to any disclaimer, the term of this patent is extended or adjusted under 35 U.S.C. 154(b) by 893 days.

(21) Appl. No.: 11/292,853

(22) Filed: Dec. 1, 2005

(65) Prior Publication Data

US 2007/0127603 A1    Jun. 7, 2007

(51) Int. Cl.
*H03D 1/00* (2006.01)
*H04L 27/06* (2006.01)

(52) U.S. Cl. .................. 375/341; 375/340; 375/262; 714/791; 714/794; 714/795; 714/796; 704/242

(58) Field of Classification Search .................. None
See application file for complete search history.

(56) References Cited

U.S. PATENT DOCUMENTS

| | | | |
|---|---|---|---|
| 6,421,553 B1 | 7/2002 | Costa et al. | |
| 6,629,041 B1 | 9/2003 | Marbach | |
| 7,130,461 B2 | 10/2006 | Rosenholtz | |
| 7,177,446 B2 | 2/2007 | Magarey | |
| 7,197,690 B2 | 3/2007 | Shen et al. | |
| 7,231,007 B2 | 6/2007 | Artamo et al. | |
| 7,236,554 B2 | 6/2007 | Gupta | |
| 7,298,772 B1 | 11/2007 | Neerudu et al. | |
| 7,308,026 B2 | 12/2007 | Purho | |
| 7,313,172 B2 | 12/2007 | Pan et al. | |
| 7,313,750 B1* | 12/2007 | Feng et al. | 714/796 |
| 7,315,566 B2 | 1/2008 | Tanno et al. | |
| 7,315,576 B1* | 1/2008 | van Nee et al. | 375/259 |
| 7,352,909 B2 | 4/2008 | Guleryuz | |
| 7,382,827 B2 | 6/2008 | Yousef et al. | |
| 7,386,058 B2 | 6/2008 | Fujii | |
| 7,397,826 B2* | 7/2008 | Gorokhov | 370/536 |
| 7,415,059 B2 | 8/2008 | Chadha et al. | |
| 7,447,277 B2 | 11/2008 | Yajima et al. | |
| 7,480,234 B1 | 1/2009 | Hart et al. | |
| 2003/0063654 A1* | 4/2003 | Onggosanusi et al. | 375/130 |

(Continued)

OTHER PUBLICATIONS

T.M. Schmidl and D.C. Cox, "Robust frequency and timing synchronization for OFDM," IEEE Transactions on Communications, Dec. 1997, pp. 1613-1621, vol. 45, No. 12.

(Continued)

*Primary Examiner*—Shuwang Liu
*Assistant Examiner*—Gina McKie
(74) *Attorney, Agent, or Firm*—Kenneth L. Sherman, Esq.; Michael Zarrabian, Esq.; Myers Andras Sherman LLP

(57) ABSTRACT

A MIMO receiver implements a method for the soft bit metric calculation with linear MIMO detection for LDPC codes, after linear matrix inversion MIMO detection. In the receiver, a detector detects the estimated symbol and the noise variance. Further, a soft metric calculation unit computes the distance between the estimated symbol and the constellation point, and then divides the distance by the noise variance to determine the soft bit metrics.

33 Claims, 9 Drawing Sheets

U.S. PATENT DOCUMENTS

| | | | |
|---|---|---|---|
| 2004/0005022 A1 | 1/2004 | Zhu et al. | |
| 2004/0076248 A1* | 4/2004 | Purho | 375/350 |
| 2004/0203456 A1* | 10/2004 | Onggosanusi et al. | 455/67.13 |
| 2004/0223480 A1* | 11/2004 | Nguyen et al. | 370/342 |
| 2005/0220175 A1 | 10/2005 | Zhou | |
| 2005/0265467 A1 | 12/2005 | Dabak et al. | |
| 2006/0018410 A1* | 1/2006 | Onggosanusi et al. | 375/340 |
| 2006/0062283 A1 | 3/2006 | Zhang et al. | |
| 2006/0092902 A1 | 5/2006 | Schmidt | |
| 2006/0105767 A1 | 5/2006 | Kim | |
| 2006/0146962 A1 | 7/2006 | Troya et al. | |
| 2006/0222095 A1 | 10/2006 | Niu et al. | |
| 2006/0227903 A1 | 10/2006 | Niu et al. | |
| 2007/0005749 A1* | 1/2007 | Sampath | 709/223 |
| 2007/0041478 A1* | 2/2007 | Kolze | 375/341 |
| 2007/0092110 A1 | 4/2007 | Xu et al. | |
| 2007/0127603 A1 | 6/2007 | Niu et al. | |
| 2008/0285685 A1* | 11/2008 | Chang et al. | 375/324 |
| 2009/0154599 A1* | 6/2009 | Siti et al. | 375/320 |

OTHER PUBLICATIONS

H. Minn, M. Zeng and V.K. Bhargava, "On timing offset estimation for OFDM systems," IEEE Communications Letters, Jul. 2000, pp. 242-244, vol. 4, No. 7.

J. Li, G. Liu and G.B. Giannakis, "Carrier frequency offset estimation for OFDM-Based WLANs" IEEE Signal Processing Letters, Mar. 2001, pp. 80-82, vol. 8, No. 3.

Byungjoon Park, et al. "A Novel Timing Estimation Method for OFDM Systems" IEEE Communications Letters, vol. 7, No. 5, May 2003, pp. 239-241.

U.S. Non-Final Office Action for U.S. Appl. No. 11/100,239 mailed Dec. 10, 2007.

U.S. Non-Final Office Action for U.S. Appl. No. 11/100,239 mailed Jun. 13, 2008.

U.S. Non-Final Office Action for U.S. Appl. No. 11/100,239 mailed Oct. 30, 2008.

U.S. Non-Final Office Action for U.S. Appl. No. 11/104,722 mailed Jan. 22, 2008.

U.S. Non-Final Office Action for U.S. Appl. No. 11/104,722 mailed Jul. 31, 2008.

U.S. Final Office Action for U.S. Appl. No. 11/104,722 mailed Jan. 6, 2009.

Office Communication, Notice of Alowance for U.S. Appl. No. 11/100,239 mailed Mar. 6, 2009.

Office Communication, Examiner's Interview Summary for U.S. Appl. No. 11/104,722 mailed May 12, 2009.

U.S. Notice of Allowance for U.S. Appl. No. 11/100,239 mailed Sep. 3, 2009.

U.S. Advisory Action for U.S. Appl. No. 11/104,722 mailed Apr. 8, 2009.

U.S. Appl. No. 11/104,722, filed Apr. 12, 2005, H. Niu et al.

G. D. Golden, C. J. Foschini, R. A. Valenzuela and P. W. Wolniansky, *Detection Algorithm and Initial Laboratory Results Using V-BLAST Space-Time Communication Architecture*, Electronics Letters, Jan. 1999, pp. 14-16, vol. 35, No. 1.

E. Zehavi, *8-PSK trellis codes for a Rayleigh channel*, IEEE Transactions on Communications, May 1992, pp. 873-884, vol. 40, No. 5.

* cited by examiner

METHOD FOR THE SOFT BIT METRIC CALCULATION WITH LINEAR MIMO DETECTION FOR LDPC CODES

FIELD OF THE INVENTION

The present invention relates to soft bit metric calculation with linear MIMO detection, and in particular to soft bit metric calculation with linear MIMO detection for LDPC codes.

BACKGROUND OF THE INVENTION

Low-Density Parity-Check (LDPC) codes have recently attracted considerable attention owing to their capacity-approaching performance and low complexity iterative decoding. LDPC codes have been adopted in many standards such as DVB-S2 and IEEE802.16e. In addition, multiple-input multiple-output (MIMO) wireless systems have proven to be a solution to the high capacity requirement of many wireless systems. Accordingly, an LDPC coded MIMO-OFDM system is considered a strong candidate for the high throughput WLAN standard.

In a MIMO spatial multiplexing system, different data streams are transmitted in parallel, simultaneously. All transmitted streams experience different channel signatures, and are received overlapped at the receiver antennas. Therefore, the receiver must perform multi-signal detection. In terms of detection performance, the maximum likelihood bit metric detection is optimal. However, the computational complexity increases exponentially in relation to constellation size and the number of transmitter antennas. Therefore, suboptimal approaches are usually needed which first detect a symbol using a linear detector, followed by a soft posterior probability (APP) processing.

For example, in a MIMO system with Nt transmitter antennas and Nr receiver antennas, a received signal y can be represented as y=Hx+n, where y is Nrx1 received symbol vector, H is an NrxNt channel matrix, x is the Ntx1 transmitted signal vector, and n is a Nrx1 noise vector. As shown in FIG. 1, the transmitted signal can be estimated as $\hat{x}$=Wy=WHx+Wn using a MIMO Detector 12 in a receiver 10, where W is the pseudo-inverse of the channel matrix H. Then, the soft bit metrics used in outer error correction coding can be calculated from the estimated symbol $\hat{x}$ in a soft metric calculation unit 14 to be used by a decoding unit 16.

The bit metrics can be calculated by finding the distance between $\hat{x}_k$ and the constellation point as the single input single output (SISO) case via the log-likelihood ratio (LLR) as in relation (1) below:

$$LLR_{ji} = (m_{ji}^1 - m_{ji}^0)/\sigma_n^2 \qquad (1)$$

$$= \left(\min_{a \in C_i^1} \|\hat{x}_j - a\|^2 - \min_{a \in C_i^0} \|\hat{x}_j - a\|^2\right)/\sigma_n^2$$

where $\hat{x}_k$ is the estimated symbol at time index k, $C_i^p$ represents the subset of the constellation point such that bit i is equal to p, a presents a particular constellation point in the subset $C_i^p$, $m_{ki}^p$ is the minimum distance between $\hat{x}_k$ and the constellation points in $C_i^p$, p∈{0,1}, and $\sigma_n^2$ represents the noise variance. For conventional convolutional decoding, the noise variance $\sigma_n^2$ can be normalized to 1, therefore, omitted in the following example without loss of generality.

FIG. 2 shows an example with QPSK modulation. FIG. 2 shows an example of calculating (1) using QPSK modulation.

For Gray labeled QPSK constellation, there are 4 symbols: $(1+j)/\sqrt{2}, (-1+j)/\sqrt{2}, (-1-j)/\sqrt{2}$ and $(1-j)/\sqrt{2}, (j=\sqrt{-1})$, mapped with 2 bits (b1b0), correspondingly as 10, 00, 01, 11. With an estimated symbol at k-th time slot $\hat{x}_k$, which is a QPSK symbol, the soft bit information (b1 and b0) must be determined from $\hat{x}_k$. Taken b0 for example (left graph in FIG. 2), both constellation point $(1+j)/\sqrt{2}$ (labeled as 10) and $(-1+j)/\sqrt{2}$ (labeled as 00) have b0 equals 0, i.e., $C_i^0 = \{(1+j)/\sqrt{2}, (-1+j)/\sqrt{2}\}$. As such, for b0=0, the minimum distance of $\hat{x}_k$ to $(1+j)/\sqrt{2}$ and $(-1+j)/\sqrt{2}$ must be found. In this case, the minimum distance $$\min_{a \in C_i^0} \|\hat{x}_k - a\|^2$$

is the distance between $\hat{x}_k$ and $(-1+j)/\sqrt{2}$. Similarly for b0=1, $$\min_{a \in C_i^1} \|\hat{x}_k - a\|^2$$

can be obtained, which is the minimum distance between $\hat{x}_k$ and $(-1-j)/\sqrt{2}$. The soft metric for b0 therefore equals to $LLR_{ki} = m_{ki}^1 - m_{ki}^0$ for i=0. The right graph in FIG. 2 shows the case for b1. Both the constellation point $(-1+j)/\sqrt{2}$ (labeled as 00) and $(-1-j)/\sqrt{2}$ (labeled as 01) have b1=0. As such, $$m_{ki}^0 = \min_{a \in C_i^0} \|\hat{x}_k - a\|^2$$

is the distance between $\hat{x}_k$ and $(-1+j)/\sqrt{2}$. Similarly, for $$b1 = 1, m_{ki}^1 = \min_{a \in C_i^1} \|\hat{x}_k - a\|^2$$

is the distance between $\hat{x}_k$ and $(1+j)/\sqrt{2}$. $LLR_{ki} = m_{ki}^1 - m_{ki}^0$, i=1 is the distance.

For convolutional codes, only the trellis difference instead of the absolute metric values is needed when applying Viterbi decoding. However, for LDPC codes where the exact message-passing decoding algorithm is applied, the exact metric is required. Scaling the soft metric causes performance degradation, therefore losing the coding gain of LDPC over convolutional codes. As such, there is a need for a method of calculating the soft metric for LDPC codes.

BRIEF SUMMARY OF THE INVENTION

In one embodiment, the present invention provides a telecommunications receiver comprising a detector that detects data symbols in the received signal by applying a linear detector following either zero forcing (ZF) or minimum mean squared error (MMSE) criterion and determines the channel noise variance, a metric calculator that calculates the soft bit metrics from the detected symbols, as a function of the distance and the noise variance, and a decoder that performs LDPC decoding of the received signals using the soft bit metrics.

The decoder performs LDPC decoding using the soft bit metrics to determine data values in the received signals. The metric calculator calculates the soft bit metrics by dividing the distance by the noise variance. In one case, the detector determines the data symbols and the corresponding noise variance by performing MMSE criterion MIMO detection. In another case, the detector determines the data symbols and the corresponding noise variance by performing ZF criterion MIMO detection. Further, the metric calculator calculates the soft bit metrics by selecting the diagonal elements $\sigma_v^2$ of the noise variance matrix $E[vv^H]$, and calculating the soft bit metrics as a function of the distance and $\sigma_v^2$.

These and other features, aspects and advantages of the present invention will become understood with reference to the following description, appended claims and accompanying figures.

DETAILED DESCRIPTION OF THE INVENTION

Figure 1:
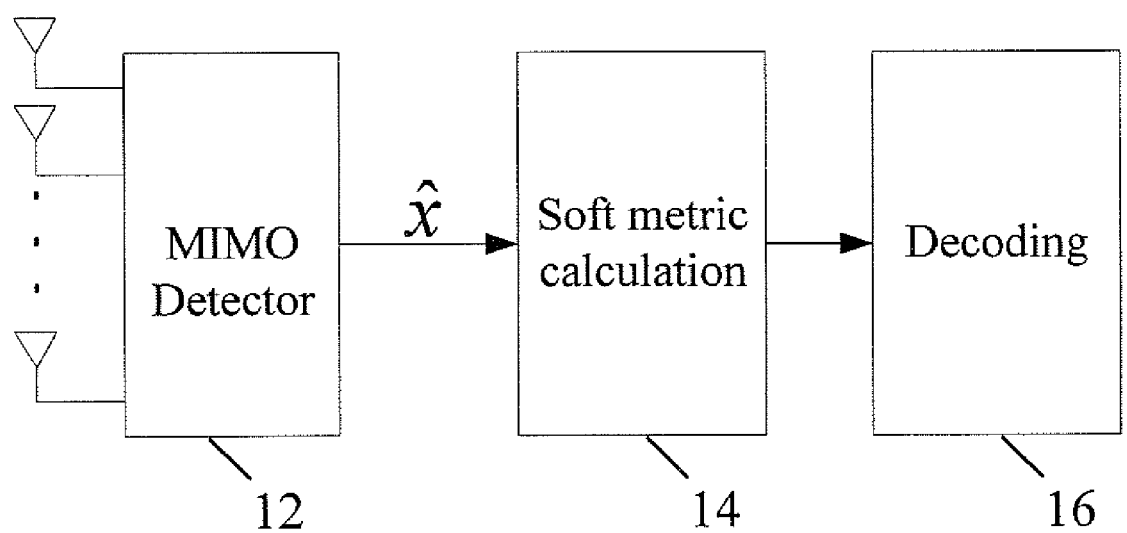
FIG. 1 shows a block diagram of a conventional receiver structure for soft decoding with a linear MIMO detector.
Figure 2:
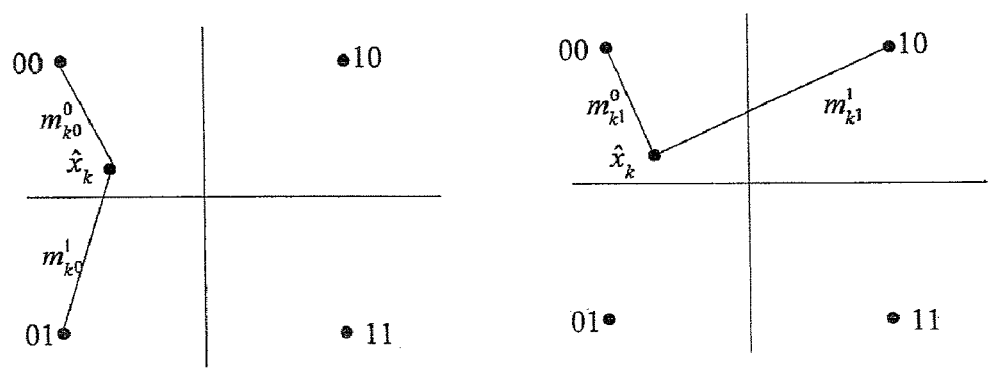
FIG. 2 shows an example distance computation using QPSK.
Figure 3:
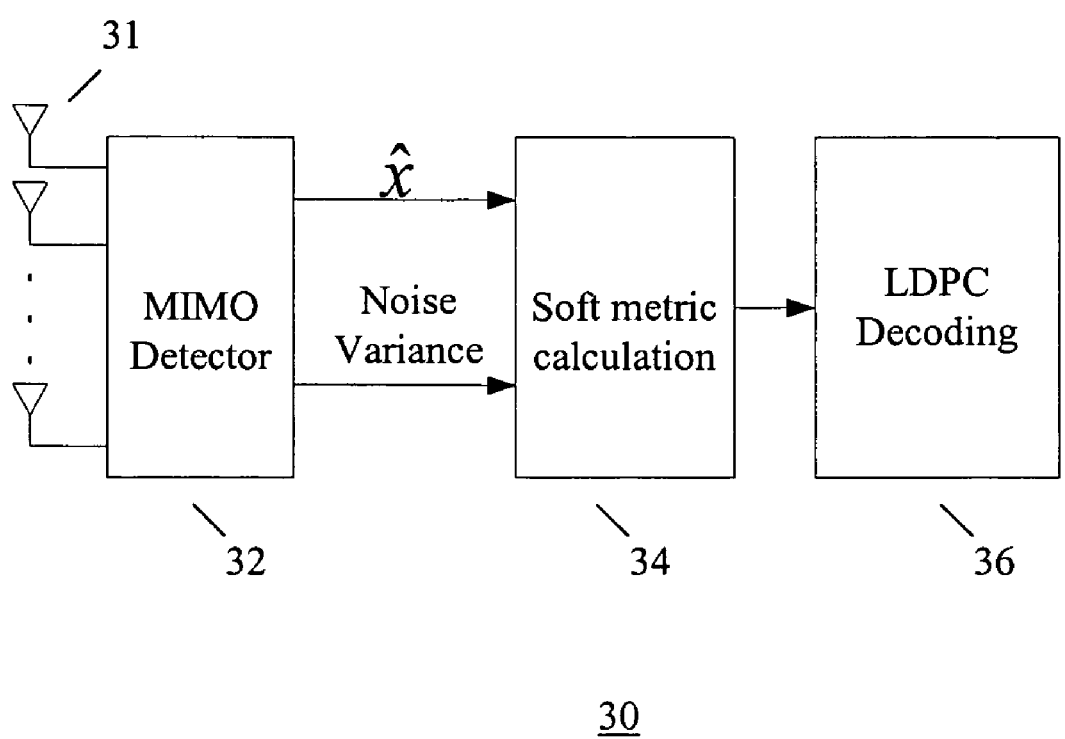
FIG. 3 shows an example block diagram on embodiment of a MIMO receiver according to an embodiment of the present invention.

In one embodiment, the present invention provides an improved soft metric calculation for LDPC codes in a receiver after linear matrix inversion MIMO detection. Referring to the example block diagram in FIG. 3, an example MIMO receiver 30 implements a method for the soft bit metric calculation with linear MIMO detection for LDPC codes, according to an embodiment of the present invention. The example MIMO receiver 30 includes multiple antenna 31, a MIMO detector 32, a soft metric calculation unit 34 and a LDPC decoding unit 36.

The MIMO detector 32 detects the estimated symbol $\hat{x}$ and the noise variance. The soft metric calculation unit 34 first computes the distance between $\hat{x}$ and the constellation point by known methods, and then divides the distance by the noise variance calculated by the MIMO detector. Initially, the noise comprises white additive noise with variance $\sigma_n^2$. After the linear MIMO detector 32, the noise includes the rotated white noise and the cross talk between different data streams. If the MIMO channel is ill-conditioned, the noise will be very large. Therefore, accurate noise variance determination is important in maintaining the LDPC decoding performance.

The noise variance determination by the linear MIMO detector 32, with both MMSE criterion and ZF criterion, is now described. Considering a MIMO transmission y=Hx+n over a channel defined by a matrix H, the linear MIMO detector 32 applies a linear filter W to the received symbols y, such that:

$$\hat{x} = Wy = WHx + Wn,$$

where $W=(H^H H+\sigma_n^2 I)^{-1}H^H$ with MMSE criterion, and $W=(H^H H)^{-1}H^H$ with ZF criterion, wherein I is identity matrix $H^H$ is the pseudo-inverse of H and $\hat{x}$ is the detected signal (estimated symbol).

Initially, the noise vector n comprises white noise with noise variance matrix $\sigma_n^2 I$. After a linear detection operation in the MIMO detector 32, the new noise term v contains the rotated noise, Wn, and the cross talk, (WH−diag(WH))x, between different data streams, wherein:

$$v = (WH - diag(WH))x + Wn.$$

The new noise v is colored noise wherein the variance matrix is no longer a diagonal matrix. Whitening the colored noise v requires complicated computations, such as the maximum likelihood detection or advanced beamforming.

Generally, the performance degradation due to the colored noise is around 3-5 dB over the 11n channel models. However, considering only the diagonal part of the noise variance matrix for each data stream greatly simplifies the system design, such that the diagonal noise variance matrix $\sigma_v^2$ is defined as:

$$\sigma_v^2 = E[diag\{vv^H\}]$$
$$= diag\{(WH - diag(WH))R_x(WH - diag(WH))^H + \sigma_n^2 WW^H\}$$
$$= diag\left\{\begin{array}{l} WHR_x H^H W^H - diag\{WH\}R_x H^H W^H - \\ WHR_x diag\{WH\} + diag\{WH\}R_x diag\{WH\} + \sigma_n^2 WW^H \end{array}\right\}$$

where $v^H$ is the pseudo-inverse of v and $W^H$ is the pseudo inverse of W.

Because $R_x$ is identical matrix which means that the input signals x are independent, using linear algebra:

$$\sigma_v^2 = E[diag\{vv^H\}] \qquad (2)$$
$$= diag\{WHH^H W^H\} - diag^2\{WH\} + diag\{\sigma_n^2 WW^H\}$$

The noise variance can be further simplified for both a MMSE MIMO detector and a ZF MIMO detector.

For a MIMO detector utilizing an MMSE estimator, based on orthogonality principles:

$$(\hat{x} - x) \perp y \Rightarrow E[y(\hat{x} - x)^H] = 0 \qquad (3)$$
$$\Rightarrow E[yy^H W] = 0$$
$$\Rightarrow (H^H H + \sigma_n^2 I)W = H^H$$
$$\Rightarrow W^H(H^H H + \sigma_n^2 I)W = W^H H^H$$
$$\Rightarrow W^H H^H - W^H(H^H H)W = \sigma_n^2 W^H W^H$$

Plugging relation (3) into relation (2) above, the diagonal matrix $\sigma_v^2$ is defined as:

$$\sigma_n^2 = E[diag\{vv^H\}] \quad (4)$$
$$= diag\{WHH^H W^H\} - diag^2\{WH\} +$$
$$diag\{W^H H^H - W^H(H^H H)W\}$$
$$= diag\{W^H H^H\} - diag^2\{WH\}$$

For a MIMO detector 32 utilizing a ZF estimator:

$$WH=(H^H H)^{-1}H^H H=I,$$

whereby the diagonal matrix $\sigma_v^2$ is defined as:

$$\sigma_v^2 = E[diag\{vv^H\}]$$
$$= \sigma_n^2 diag\{WW^H\}$$

Finally, the soft metric for each data stream is calculated in the soft metric calculation unit 34 as: distance/$\sigma_v^2$. This provides exact metric for LDPC codes with improved detection performance.

Figure 4:
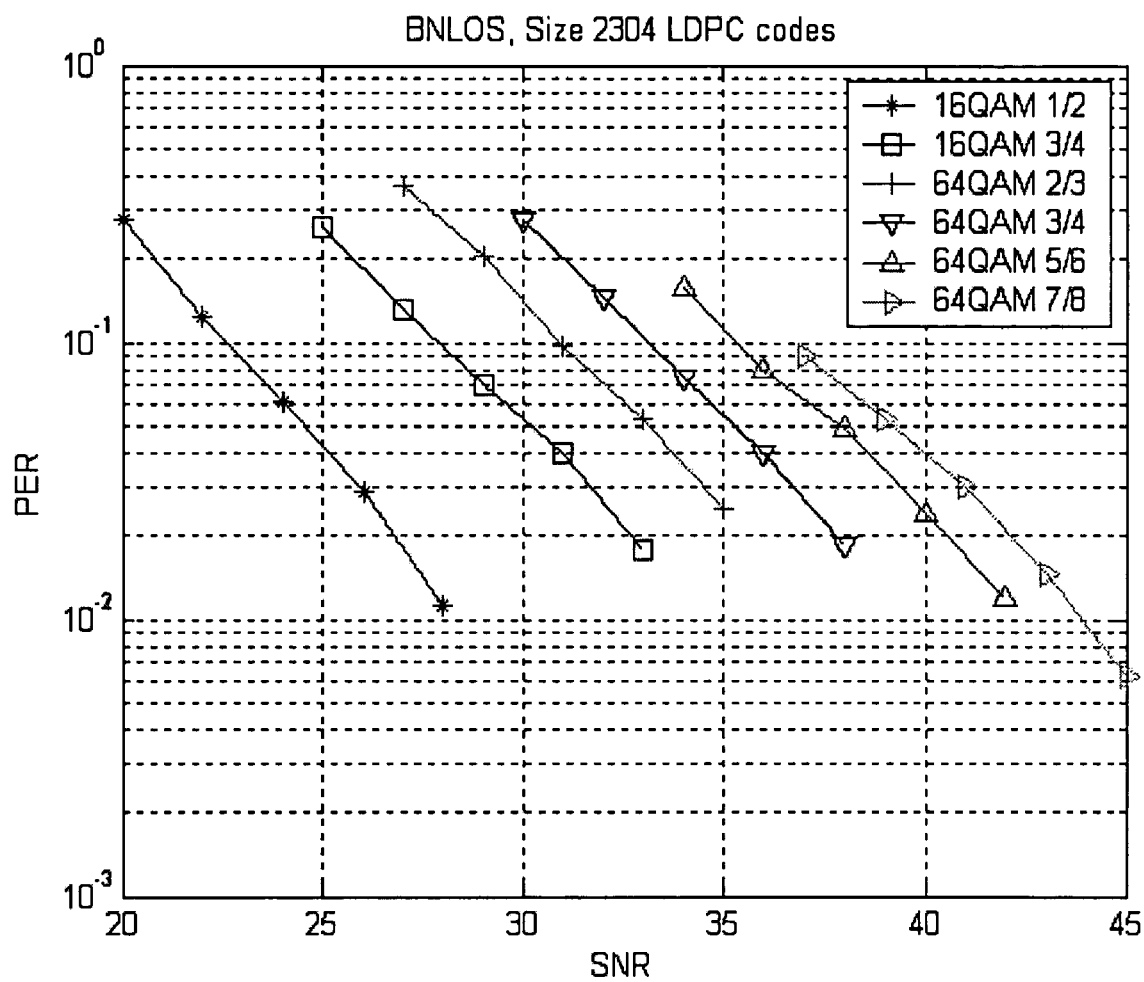
FIG. 4 shows performance example of an LDPC coded 2×2 MIMO-OFDM system according to the present invention over B-NLOS channel.
Figure 5:
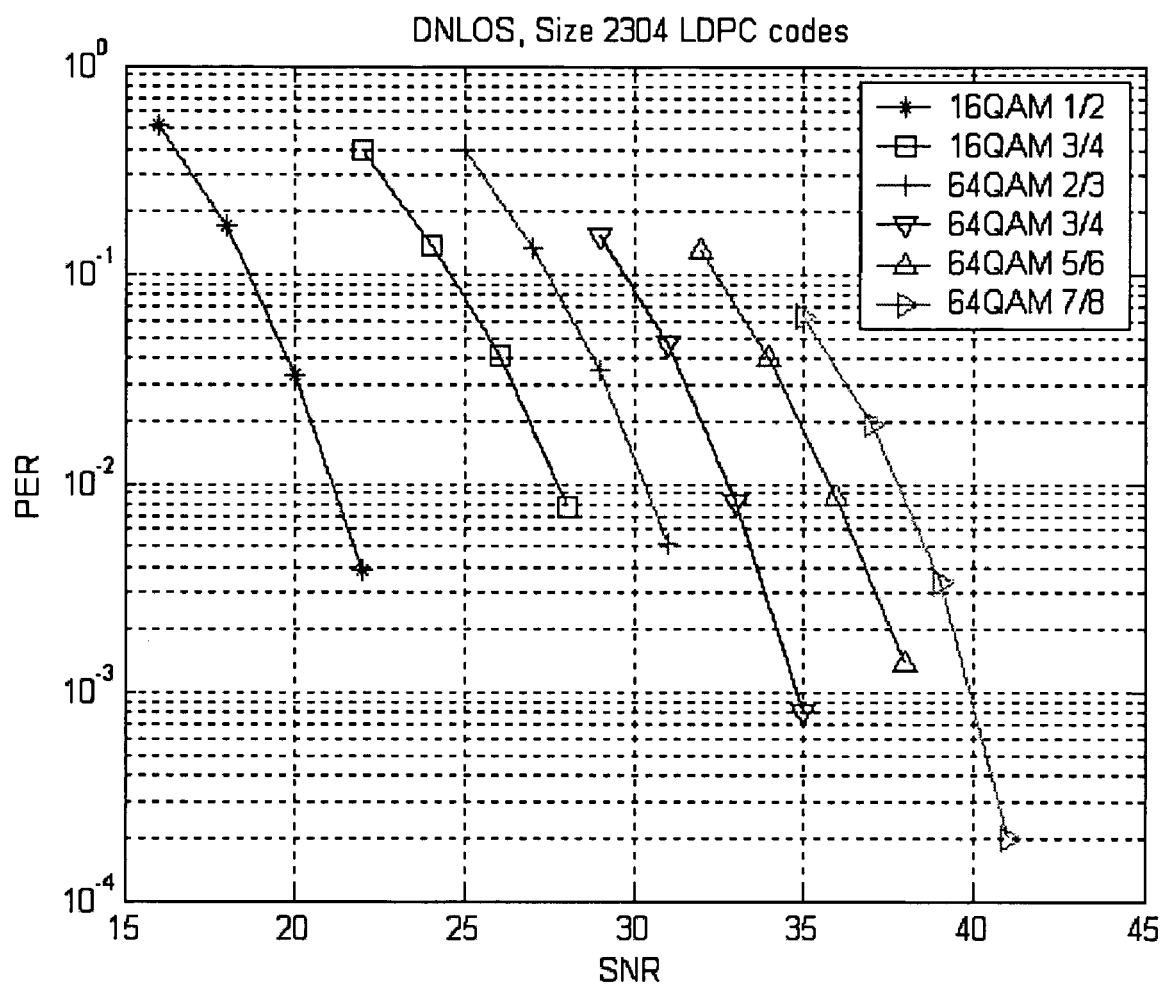
FIG. 5 shows performance of an example LDPC coded 2×2 MIMO-OFDM system according to the present invention over D-NLOS channel.
Figure 6:
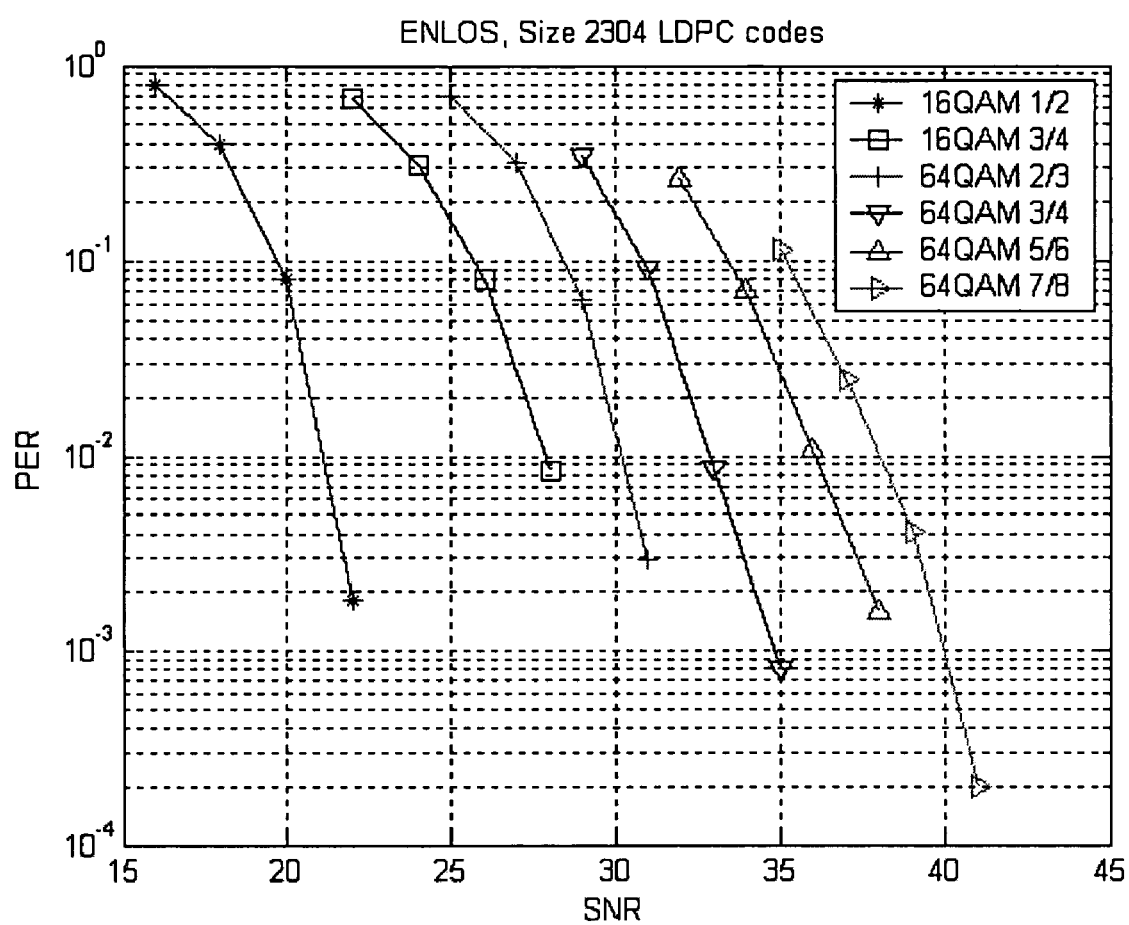
FIG. 6 shows performance of an example LDPC coded 2×2 MIMO-OFDM system according to the present invention over E-NLOS channel.

Performance examples (signal-to-noise ratio (SNR) v. PER (packet error rate) for a 2×2 MMSE MIMO detector 32 using IEEE802.11n channels BNLOS, DNLOS, ENLOS with different coding and modulation according to embodiments the present invention are shown by examples in FIGS. 4, 5 and 6, respectively. A size 2304 LDPC code is simulated with different modulation schemes and coding rates. In the legends for FIGS. 4-6, "16QAM ½" means that 16QAM modulation with rate ½ LDPC codes is used, "16QAM ¾" means that 16QAM modulation with rate ¾ LDPC codes is used, "64QAM ⅔" that 64QAM modulation with rate ⅔ LDPC codes is used, and so on. In general, the LDPC code performance according to the present invention is 2-3 dB better than convolutional codes.

Figure 7:
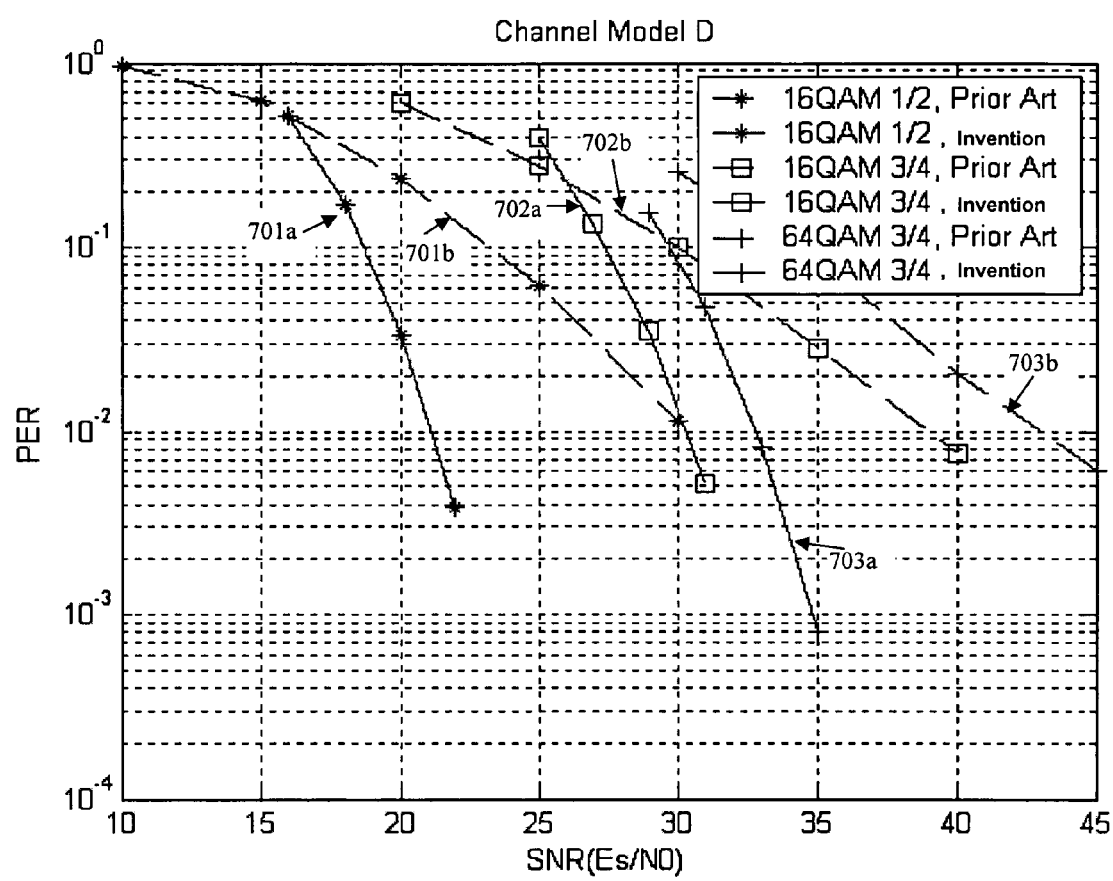
FIG. 7 shows performance comparison of an example soft metric calculation according to the present invention over the prior art in an example 2×2 MIMO-OFDM system with D-NLOS channel.

FIG. 7 shows a comparison of performance of an embodiment of the soft metric calculation according to the present invention, in relation to that of a prior art methods, over a IEEE802.11n channel model D, for 16QAM ½ (701a present invention, 701b prior art) 16QAM ¾ (702a present invention, 702b prior art) and 64QAM ¾ (703a present invention, 703b prior art) rate codes. As FIG. 7 shows, significant performance improvement is observed over the prior art. The above derived soft metrics can also be used in convolutional codes. Prior art shows the performance with the noise variance is $\sigma_n^2$. The improved performance curves 701a, 702a and 703a are with noise variance $\sigma_v^2$ obtained according to the present invention.

Figure 8:
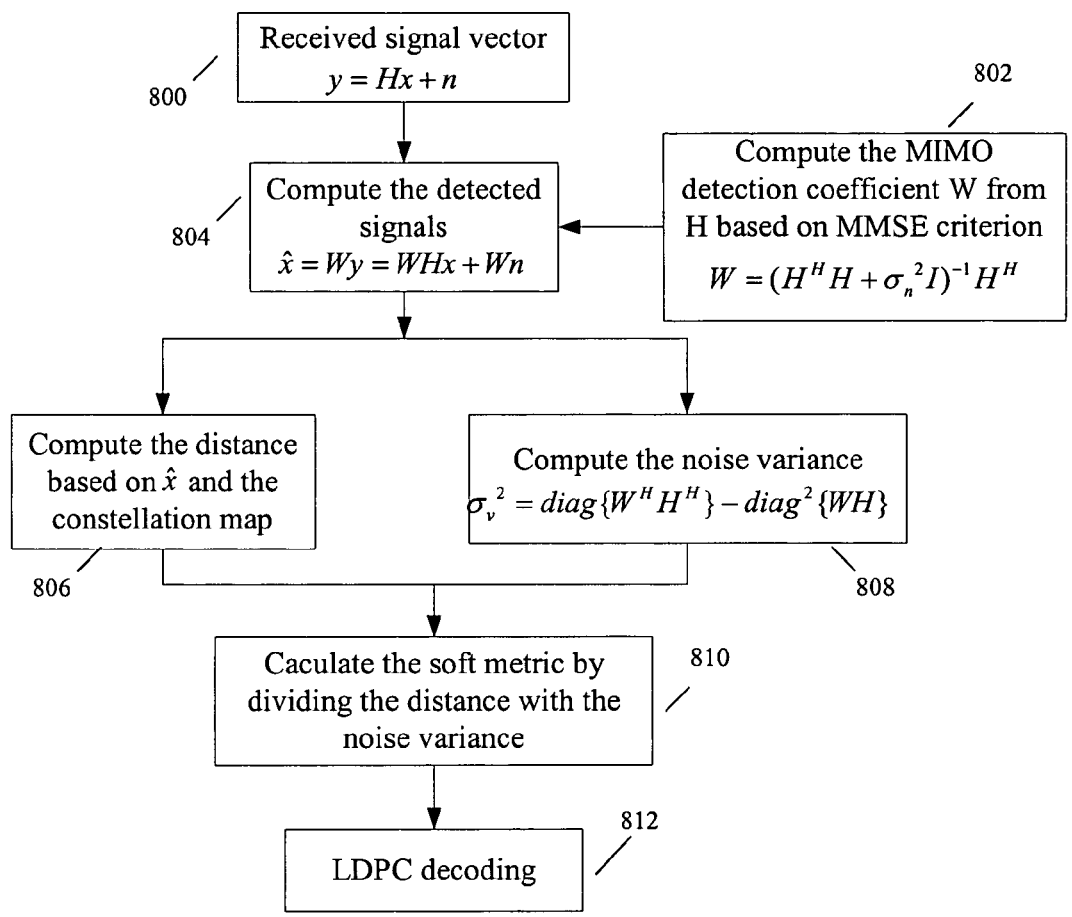
FIG. 8 shows an example flowchart of the steps of noise variance determination using MMSE criterion according to an embodiment of the present invention.

FIG. 8 shows an example flowchart of the steps of noise variance determination using MMSE criterion discussed above, according to an embodiment of the present invention, including the steps of: receive the signal vector y (step 800), compute MIMO detection coefficient W from channel matrix based on MMSE criterion (step 802), compute detected symbol $\hat{x}$ based on the received signals y and the MIMO detection coefficient W (step 804), compute the distance between $\hat{x}$ and the constellation point based on the detected signal and the constellation map (step 806), compute the noise variance $\sigma_v^2$ (step 808), calculate the soft metric by dividing the distance with the noise variance (step 810), and perform LPDC decoding (step 812).

Figure 9:
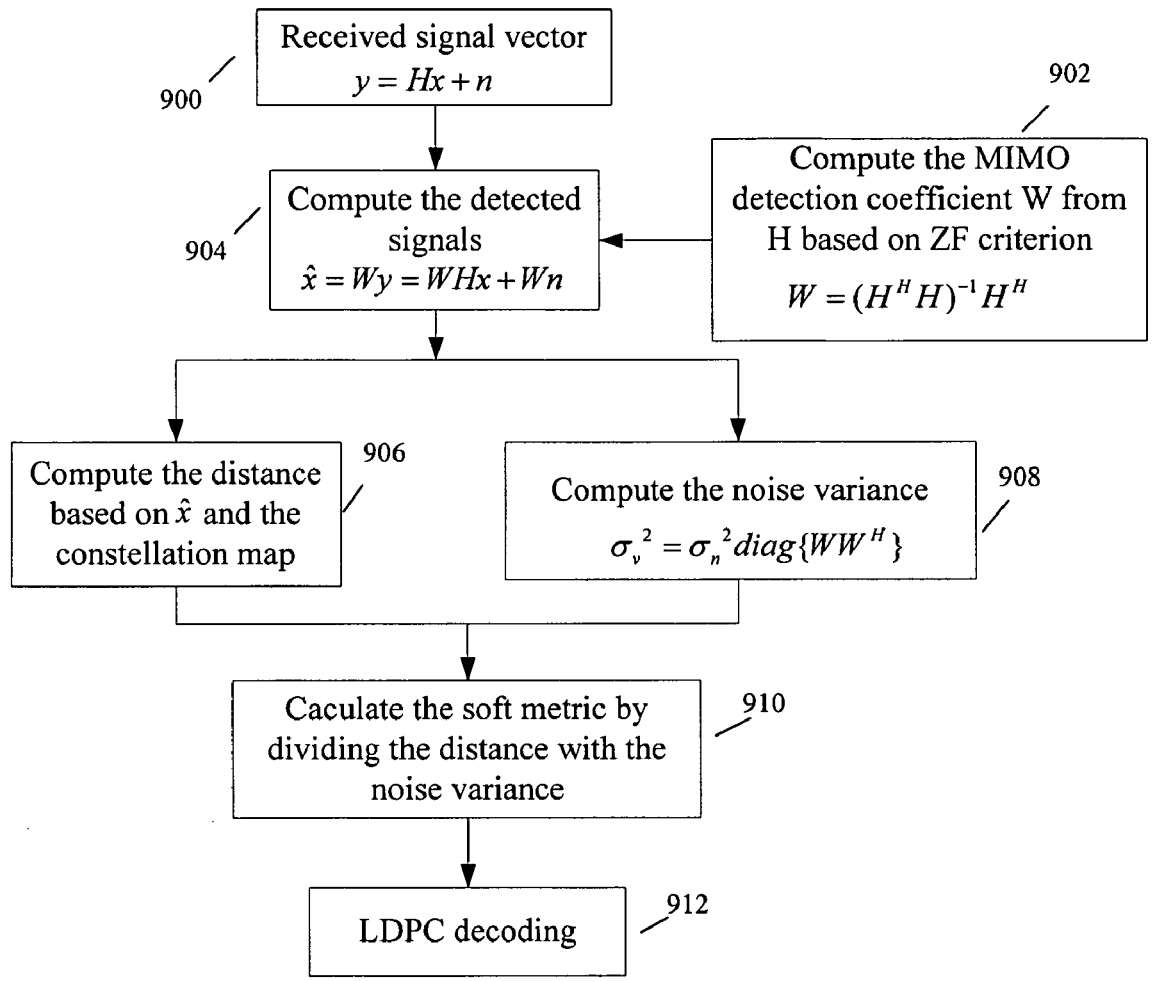
FIG. 9 shows an example flowchart of the steps of noise variance determination using ZF criterion according to an embodiment of the present invention.

FIG. 9 shows an example flowchart of the steps of noise variance determination using ZF criterion discussed above, according to an embodiment of the present invention, including the steps of: receive the signal vector y (step 900), compute MIMO detection coefficient W from channel matrix based on ZF criterion (step 902), compute detected symbol $\hat{x}$ based on the received signals y and the MIMO detection coefficient W (step 904), compute the distance between $\hat{x}$ and the constellation point based on the detected signal and the constellation map (step 906), compute the noise variance $\sigma_v^2$ (step 908), calculate the soft metric by dividing the distance with the noise variance (step 910), and perform LPDC decoding (step 912).

The present invention has been described in considerable detail with reference to certain preferred versions thereof; however, other versions are possible. Therefore, the spirit and scope of the appended claims should not be limited to the description of the preferred versions contained herein.

What is claimed is:

1. A method of soft bit metric calculation for received data signals via a channel in a telecommunications receiver utilizing Low Density Parity Check (LDPC) decoding, comprising:
   detecting data symbols in the received signals by applying a linear Multiple-Input Multiple-Output (MIMO) detection, wherein the linear MIMO detection comprises determining distances between the detected data symbols and constellation points;
   determining a noise variance of the channel;
   calculating the soft bit metrics as a function of the distances between the detected data symbols and the constellation points, and calculating a channel noise variance matrix $E[vv^H]$, wherein the distances are divided by the noise variance, wherein calculating the soft bit metrics further includes:
      selecting diagonal elements of the channel noise variance matrix $E[vv^H]$, and
      calculating the soft bit metrics as a function of the distances and $\sigma_v^2$, where the diagonal elements $\sigma_v^2$ is defined as:

$$\sigma_v^2 = E[diag\{vv^H\}]$$
$$= \sigma_n^2 diag\{WW^H\},$$

W is a linear filter and $W^H$ is a pseudo-inverse of W, $\sigma_n^2$ represents the noise variance and v is a new noise term and $v^H$ is a pseudo-inverse of V.

2. The method of claim 1, further comprising:
   LDPC decoding using the soft bit metrics to determine data values in the received signals.

3. The method of claim 1, wherein the determining the noise variance further includes performing minimum mean squared error (MMSE) criterion MIMO detection.

4. The method of claim 3 wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector y=Hx+n, n represents a Nrx1 noise vector, the method further comprising applying a linear filter W to the received symbols y to compute estimated symbols $\hat{x}$ as:

$$\hat{x}=Wy=WHx+Wn,$$

where $W=(H^H H+\sigma_n^2 I)^{-1}H^H$ with MMSE criterion, where $H^H$ is a pseudo-inverse of H.

5. The method of claim 1 wherein the determining the noise variance further includes performing Zero Forcing (ZF) criterion MIMO detection.

6. The method of claim 5 wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector $y=Hx+n$, n represents a Nrx1 noise vector, the method further comprising applying a linear filter W to the received symbols y to compute estimated symbols $\hat{x}$ as:

$$\hat{x}=Wy=WHx+Wn,$$

where $W=(H^HH)^{-1}H^H$ with ZF criterion and $H^H$ is a pseudo-inverse of H.

7. The method of claim 1, wherein the calculating the soft bit metrics further includes:
determining the new noise term $v=(WH-diag(WH))x+Wn$ where filtering effect and cross-talk are considered,
selecting the diagonal elements $\sigma_v^2$ of the noise variance matrix $E[vv^H]$,
calculating the soft bit metrics as a function of the distance and $\sigma_v^2$, where W is a linear filter, H is a NrxNt channel matrix in a MIMO system having a receiver with Nt transmitter antennas and Nr receiver antennas, x is the Ntx1 transmitted signal vector, n represents a Nrx1 noise vector and $v^H$ is a pseudo-inverse of v.

8. The method of claim 7, wherein the determining the noise variance further includes performing Zero Forcing (ZF) criterion MIMO detection, wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector $y=Hx+n$, n represents a Nrx1 noise vector, the method further comprising applying a linear filter W to the received symbols y to compute estimated symbols $\hat{x}$ as:

$$\hat{x}=Wy=WHx+Wn,$$

where $W=(H^HH)^{-1}H^H$ with ZF criterion,
such that for ZF estimation:

$$WH=(H^HH)^{-1}H^HH=I.$$

9. The method of claim 7 wherein the soft bit metric of a first received data stream is divided by a first diagonal element of the noise variance matrix, and the soft metric of a second received data stream is divided by a second diagonal element of the noise variance matrix.

10. The method of claim 1 wherein the receiver comprises a wireless MIMO receiver.

11. The method of claim 10 wherein the receiver receives multiple data streams signals from a transmitter with multiple antennas.

12. The method of claim 1 wherein:
the detecting data symbols further includes detecting the data symbols in the received signal using linear matrix inversion MIMO detection, and
the calculating the bit metrics further includes computing the bit metrics by determining distances between the detected data symbols and constellation points.

13. A telecommunications receiver, comprising:
a detector that detects data symbols in received signals by determining distances between received signal points and constellation points, and determines channel noise variance;
a metric calculator that calculates soft bit metrics for the received signals via a channel, as a function of the distances and the noise variance, wherein the distances are divided by the noise variance, wherein the metric calculator calculates the soft bit metrics by:
selecting diagonal elements $\sigma_v^2$ of the noise variance matrix $E[vv^H]$,
calculating the soft bit metrics as a function of the distances and $\sigma_v^2$, where the diagonal elements $\sigma_v^2$ is defined as:

$$\sigma_v^2=E[diag\{vv^H\}]$$
$$=\sigma_n^2 diag\{WW^H\},$$

W is a linear filter and $W^H$ is a pseudo-inverse of W, $\sigma_n^2$ represents the noise variance and v is a new noise term and $v^H$ is a pseudo-inverse of v; and
a decoder that performs LDPC decoding of the received signals using the soft bit metrics.

14. The receiver of claim 13 wherein the decoder performs LDPC decoding using the soft bit metrics to determine data values in the received signals.

15. The receiver of claim 13 wherein the detector determines the noise variance by performing minimum mean squared error (MMSE) criterion MIMO detection.

16. The receiver of claim 15 wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector $y=Hx+n$, n represents a Nrx1 noise vector, such that detector applies a linear filter W to the received symbols y to compute estimated symbols $\hat{x}$ as:

$$\hat{x}=Wy=WHx+Wn,$$

where $W=(H^HH+\sigma_n^2I)^{-1}H^H$ with MMSE criterion and $H^H$ is a pseudo-inverse of H.

17. The receiver of claim 13 wherein the detector determines the noise variance by performing Zero Forcing (ZF) criterion MIMO detection.

18. The receiver of claim 17 wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector $y=Hx+n$, n represents a Nrx1 noise vector, such that the detector applies a linear filter W to the received symbols y to compute estimated symbols $\hat{x}$ as:

$$\hat{x}=Wy=WHx+Wn,$$

where $W=(H^HH)^{-1}H^H$ with ZF criterion and $H^H$ is a pseudo-inverse of H.

19. The receiver of claim 13, wherein the detector determines the noise variance by performing Zero Forcing (ZF) criterion MIMO detection, wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector $y=Hx+n$, n represents a Nrx1 noise vector, such that the detector applies a linear filter W to the received symbols y to compute estimated symbols $\hat{x}$ as:

$$\hat{x}=Wy=WHx+Wn,$$

where $W=(H^HH+\sigma_n^2I)^{-1}H^H$ with ZF criterion and $\sigma_n^2$ represents the noise variance,
such that for ZF estimation:

$$WH=(H^HH)^{-1}H^HH=I.$$

20. The receiver of claim 13 wherein the soft bit metric of a first received data stream is divided by a first diagonal element of the noise variance matrix, and the soft metric of a second received data stream is divided by a second diagonal element of the noise variance matrix.

21. The receiver of claim 13 wherein the receiver comprises a wireless MIMO receiver.

22. The receiver of claim 21 wherein the receiver receives multiple data streams signals from a transmitter with multiple antennas.

23. The receiver of claim 13 wherein:
the detector detects the data symbols in the received signal using direct matrix inversion type linear MIMO detection, and
the metric calculator computes the bit metrics by determining distances between the detected data symbols and constellation points.

24. A wireless communication receiver, comprising:
a detector configured to detect symbols by determining distances between received signal points and constellation points, and to determine channel noise variance in a received data signal by applying a linear MIMO detection;
a metric calculator configured to select diagonal elements $\sigma_v^2$ of a noise variance matrix $E[vv^H]$ and calculate soft bit metrics for the received data signal via a channel by selecting the diagonal elements $\sigma_v^2$ of the noise variance matrix $E[vv^H]$ as a function of the distances and $\sigma_v^2$, where the diagonal elements $\sigma_v^2$ is defined as:

$$\sigma_v^2 = E[diag\{vv^H\}]$$

$$= \sigma_n^2 diag\{WW^H\},$$

W is a linear filter, $W^H$ is a pseudo-inverse of W, $\sigma_n^2$ represents the noise variance and v is a new noise term and $v^H$ is a pseudo-inverse of v.

25. The wireless communication receiver of claim 24, wherein the soft bit metrics are calculated by dividing the distances by the noise variance.

26. The wireless communication receiver of claim 24, further comprising a decoder that performs LDPC decoding of the received data signal using the soft bit metrics.

27. The wireless receiver of claim 24, wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector y=Hx+n, n represents a Nrx1 noise vector, such that detector applies the linear filter W to the received symbols y to compute estimated symbols $\hat{x}$ as:

$$\hat{x} = Wy = WHx + Wn,$$

where $W = (H^H H + \sigma_n^2 I)^{-1} H^H$ with minimum mean squared error (MMSE) criterion and $H^H$ is a pseudo-inverse of H.

28. The wireless receiver of claim 24, wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector y=Hx+n, n represents a Nrx1 noise vector,
such that the detector applies a linear filter W to the received symbols y to compute estimated symbols $\hat{x}$ as:

$$\hat{x} = Wy = WHx + Wn,$$

where $W = (H^H H)^{-1} H^H$ with Zero Forcing (ZF) criterion and $H^H$ is a pseudo-inverse of H.

29. A method of soft bit metric calculation for received data signals via a channel in a telecommunications receiver utilizing LDPC decoding, comprising:
detecting data symbols in the received signals by applying a linear MIMO detection, wherein the linear MIMO detection comprises determining distances between the detected data symbols and constellation points;
determining a noise variance of the channel;
calculating the soft bit metrics as a function of the distances between the detected data symbols and the constellation points, and calculating a channel noise variance matrix $E[vv^H]$, wherein the distances are divided by the noise variance, said calculating further includes selecting the diagonal elements $\sigma_v^2$ of the noise variance matrix $E[vv^H]$ as a function of the distances and $\sigma_v^2$, where the diagonal elements $\sigma_v^2$ is defined as:

$$\sigma_v^2 = E[diag\{vv^H\}]$$

$$= \sigma_n^2 diag\{WW^H\},$$

where W is a linear filter, $W^H$ is a pseudo-inverse of W, $\sigma_n^2$ represents the noise variance and v is a new noise term and $v^H$ is a pseudo-inverse of v,
wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector y=Hx+n, n represents a Nrx1 noise vector, the method further comprising applying the linear filter W to the received symbols y to compute estimated symbols $\hat{x}$ as:

$$\hat{x} = Wy = WHx + Wn,$$

where $W = (H^H H + \sigma_n^2 I)^{-1} H^H$ with MMSE criterion, where $H^H$ is a pseudo-inverse of H.

30. A telecommunications receiver, comprising:
a detector that detects data symbols in received signals by determining distances between received signal points and constellation points, and determines noise variance of a channel;
a metric calculator that calculates soft bit metrics for the received signals via the channel, as a function of the distances and the noise variance, wherein the distances are divided by the noise variance, said calculator further selects the diagonal elements $\sigma_v^2$ of a noise variance matrix $E[vv^H]$ as a function of the distances and $\sigma_v^2$, where the diagonal elements $\sigma_v^2$ is defined as:

$$\sigma_v^2 = E[diag\{vv^H\}]$$

$$= \sigma_n^2 diag\{WW^H\},$$

where W is a linear filter, $W^H$ is a pseudo-inverse of W, $\sigma_n^2$ represents the noise variance and v is a new noise term and $v^H$ is a pseudo-inverse of v; and
a decoder that performs LDPC decoding of the received signals using the soft bit metrics, wherein the channel is defined by a NrxNt channel matrix H in a MIMO system having a receiver with Nt transmitter antennas and Nr receiver antennas, x is the Ntx1 transmitted signal vector, the received symbol is represented by a Nrx1 received symbol vector y=Hx+n, n represents a Nrx1 noise vector, such that the detector applies the linear filter W to the received symbols y to compute estimated symbols $\hat{x}$ as:

$$\hat{x} = Wy = WHx + Wn,$$

where $W = (H^H H + \sigma_n^2 I)^{-1} H^H$ with MMSE criterion and $H^H$ is a pseudo-inverse of H.

31. A method of soft bit metric calculation for received signals via a channel in a telecommunications receiver utilizing LDPC decoding, comprising:
detecting data symbols in the received signals by applying a linear MIMO detection, wherein the linear MIMO detection comprises determining distances between the detected data symbols and constellation points;

determining a noise variance of the channel;

calculating the soft bit metrics as a function of the distances between the detected data symbols and the constellation points, and calculating a channel noise variance matrix $E[vv^H]$, wherein the distances are divided by the noise variance, wherein calculating the soft bit metrics further includes:

selecting diagonal elements $\sigma_v^2$ of the channel noise variance matrix $E[vv^H]$ and calculating the soft bit metrics as a function of the distances and the diagonal elements $\sigma_v^2$, where the diagonal elements $\sigma_v^2$ is defined as:

$\sigma_v^2 = E[diag\{vv^H\}]$ $= \sigma_n^2 diag\{WW^H\}$,

W is a linear filter, $W^H$ is a pseudo-inverse of W, $\sigma_n^2$ represents the noise variance and v is a new noise term and $v^H$ is a pseudo-inverse of v.

32. A telecommunications receiver, comprising:

a detector that detects data symbols in signals received via a channel by determining distances between received signal points and constellation points, and determines noise variance of the channel;

a metric calculator that calculates soft bit metrics for the received signals, as a function of the distances and the noise variance, wherein the distances are divided by the noise variance, wherein the metric calculator calculates the soft bit metrics by:

selecting the diagonal elements $\sigma_v^2$ of a channel noise variance matrix $E[vv^H]$, calculating the soft bit metrics as a function of the distances and the diagonal elements $\sigma_v^2$, where the diagonal elements $\sigma_v^2$ is defined as:

$\sigma_v^2 = E[diag\{vv^H\}]$ $= \sigma_n^2 diag\{WW^H\}$,

W is a linear filter, $W^H$ is a pseudo-inverse of W, $\sigma_n^2$ represents the noise variance and v is a new noise term and $v^H$ is a pseudo-inverse of v; and a decoder that performs LDPC decoding of the received signals using the soft bit metrics.

33. A wireless communication receiver, comprising:

a detector configured for detecting symbols by determining distances between received signal points and constellation points, and for determining channel noise variance in a received data signal by applying a linear MIMO detection;

a metric calculator configured for selecting diagonal elements $\sigma_v^2$ of a noise variance matrix $E[vv^H]$ and for calculating soft bit metrics for the received data signal via a channel by selecting the diagonal elements $\sigma_v^2$ of the noise variance matrix $E[vv^H]$, and calculating the soft bit metrics as a function of the distances and the diagonal elements $\sigma_v^2$, where the diagonal elements $\sigma_v^2$ is defined as:

$\sigma_v^2 = E[diag\{vv^H\}]$ $= \sigma_n^2 diag\{WW^H\}$,

W is a linear filter, $W^H$ is a pseudo-inverse of W, $\sigma_n^2$ represents the noise variance and v is a new noise term and $v^H$ is a pseudo-inverse of v.

* * * * *